(12) United States Patent
Witcraft et al.

(10) Patent No.: US 6,850,057 B2
(45) Date of Patent: Feb. 1, 2005

(54) BARBER POLE STRUCTURE FOR MAGNETORESISTIVE SENSORS AND METHOD OF FORMING SAME

(75) Inventors: William F. Witcraft, Minneapolis, MN (US); Lonny Berg, Elk River, MN (US); Mae W. Ng, Edina, MN (US); Tom Yeh, Arden Hills, MN (US)

(73) Assignee: Honeywell International, Inc., Morristown, NJ (US)

( * ) Notice: Subject to any disclaimer, the term of this patent is extended or adjusted under 35 U.S.C. 154(b) by 147 days.

(21) Appl. No.: 09/908,834

(22) Filed: Jul. 19, 2001

(65) Prior Publication Data

US 2003/0016011 A1 Jan. 23, 2003

(51) Int. Cl.7 .............................................. G01R 33/02
(52) U.S. Cl. ........................ 324/252; 428/692; 428/682
(58) Field of Search .................................. 428/692, 693, 428/900; 374/252, 235, 207, 21; 338/32 R

(56) References Cited

U.S. PATENT DOCUMENTS 4,847,584 A * 7/1989 Pant .......................... 324/252
5,719,494 A   2/1998 Dettmann et al.

FOREIGN PATENT DOCUMENTS

DE   197 40 408 A1   3/1998
JP   403219682   *   9/1991   ............... 338/32 R

OTHER PUBLICATIONS

J.E. Lenz et al., "A High–Sensitivity Magnetoresistive Sensor", Honeywell Systems and Research Center, no date.
M. Endoh et al., "Highly Sensitive Thin Film Magnetoresistive Sensor With Good Linearity", pp. 210–214, no date.
Article by Bharat B. Pant with Honeywell Solid State Electronics Division), Title: Magnetoresistive Sensors found in the Scientific Honeywell, Fall 1987, pp. 29–34.

* cited by examiner

Primary Examiner—Jay Patidar
(74) Attorney, Agent, or Firm—Schiff Hardin LLP

(57) ABSTRACT

A method of making a magnetorestrictive sensor involves the deposition of a magnetorestrictive strip over a substrate, the deposition of an insulating layer over the magnetorestrictive strip, the etching of barber pole windows through the insulating layer, the deposition of a conductive material over the insulating layer and into the barber windows, and the etching away of the conductive material between the barber pole windows so as to form barber poles. In this manner, the formation of the barber poles is controlled by the windows formed in the insulating layer.

43 Claims, 6 Drawing Sheets

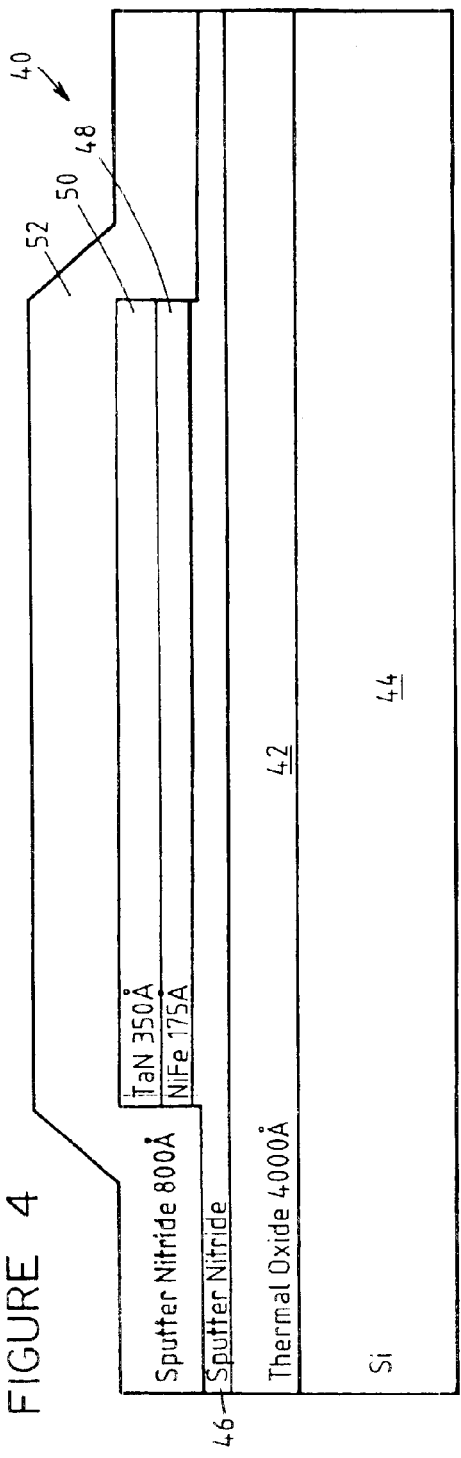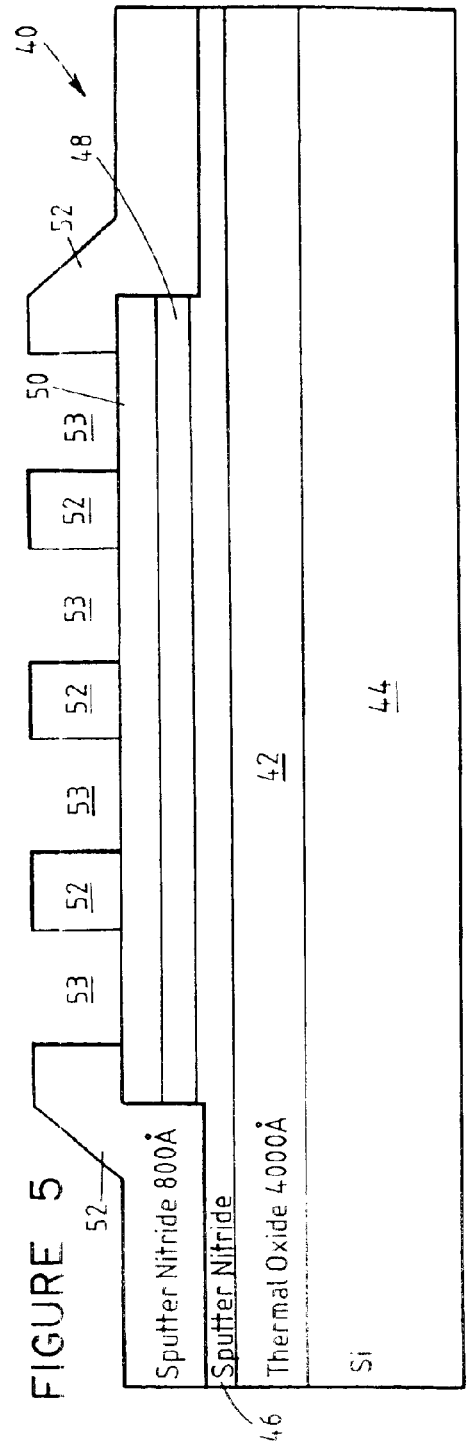
FIGURE 4
FIGURE 5

BARBER POLE STRUCTURE FOR MAGNETORESISTIVE SENSORS AND METHOD OF FORMING SAME

TECHNICAL FIELD OF THE INVENTION

The present invention relates in general to magnetic field sensors and, more particularly, to magnetoresistive sensors.

BACKGROUND OF THE INVENTION

Magnetoresistive sensors are typically small and can generally measure magnetic fields on the order of 0.001 gauss to 100 gauss. Also, magnetoresistive sensors are able to measure D.C. fields as well as fields having frequencies up to and exceeding a megahertz. Accordingly, magnetoresistive sensors are used in a wide variety of applications such as current sensing, proximity sensing, etc.

The magnetoresistive material used in making magnetoresistive sensors is a material whose resistance changes in the presence of a magnetic field. Permalloy, which is a nickle/iron alloy, is such a material and is often provided as a film for use in magnetoresistive sensors. The resistance of the film varies according to the square of the cosine of the angle between the magnetization direction and the current direction.

The response of a magnetoresistive material is measured as $\Delta R/R_N$, where $\Delta R$ is the change in resistance of the magnetoresistive material and $R_N$ is the nominal resistance of the magnetoresistive material. The change in the resistance $\Delta R$ of Permalloy between the point where the magnetization direction is parallel to the current direction and the point where the magnetization direction is perpendicular to the current direction is on the order of 2% of the nominal resistance of the material.

Moreover, the plot of $\Delta R/R_N$ versus the angle between the magnetization direction and the current direction is bell shaped. In order to operate the magnetoresistive material on the linear part of this curve, a bias field is frequently applied to the magnetoresistive sensor. For example, either a solenoid wrapped around the magnetoresistive sensor package or a plurality of thin-film permanent magnets at the end of the magnetoresistive sensor are usually used to bias the magnetoresistive material at this linear portion.

Alternatively, instead of applying a biasing field to the magnetoresistive sensor, it is known to provide the magnetoresistive sensor with conductive barber poles. Unlike the bias field which rotates the magnetization direction with respect to the current direction, barber poles instead rotate the current direction with respect to the magnetization direction.

Magnetoresistive sensors are frequently used in Wheatstone bridges. Thus, each of the four legs of a Wheatstone bridge contains a magnetoresistive sensor. A top view of an exemplary known Wheatstone bridge 10 is shown in FIG. 1. The Wheatstone bridge 10 includes four magnetoresistive sensors 12, 14, 16, and 18. The magnetoresistive sensor 12 is formed from a Permalloy film 20 and has a set of barber poles 22 for biasing. The magnetoresistive sensor 14 is formed from a Permalloy film 24 and has a set of barber poles 26 for biasing. The magnetoresistive sensor 16 is formed from a Permalloy film 28 and has a set of barber poles 30 for biasing. Finally, the magnetoresistive sensor 18 is formed from a Permalloy film 32 and has a set of barber poles 34 for biasing.

The nominal resistances of the four legs are ideally identical so that the Wheatstone bridge 10 is balanced and has no output in the absence of a magnetic field. The use of a bias field to operate the magnetoresistive material forming the magnetoresistive sensors 12, 14, 16, and 18 in the Wheatstone bridge 10 at the linear portion of the magnetization/current curve does not upset this balance because the resistances of the four sensors change by the same amount in response to the bias field.

The use of barber poles, however, can upset this balance, such as where the barber poles are not uniformly formed over the magnetoresistive material of the four sensors. As described above, an imbalance causes the bridge to have an output even when no magnetic field is present. This output is usually referred to as offset. Accordingly, it is known to reduce this offset through the use of laser trimming. However, laser trimming adds cost to devices such as Wheatstone bridges which use magnetoresistive sensors.

The present invention is directed, at least in one embodiment, to an arrangement of barber poles which allows tighter control of offset and, therefore, reduces the need for laser trimming.

SUMMARY OF THE INVENTION

In accordance with one aspect of the present invention, a method of making a magnetoresistive sensor comprises the following: forming a dielectric over a magnetoresistive material; forming barber pole windows through the dielectric; and, forming barber poles through the barber pole windows.

In accordance with another aspect of the present invention, a method of making a magnetoresistive sensor comprises the following: depositing a magnetoresistive strip over a substrate; depositing an insulating layer over the magnetoresistive strip; etching barber pole windows through the insulating layer; depositing a conductive material over the insulating layer and into the barber windows; and, etching away the conductive material between the barber pole windows so as to form barber poles.

In accordance with yet another aspect of the present invention, a magnetoresistive sensor comprises a substrate, a magnetoresistive strip over the substrate, barber poles of conductive material over the magnetoresistive strip, and a dielectric between adjacent ones of the barber poles.

BRIEF DESCRIPTION OF THE DRAWINGS

These and other features and advantages will become more apparent from a detailed consideration of the invention when taken in conjunction with the drawings in which:

FIG. 4 shows the magnetoresistive sensor following a Permalloy etch and a sputter nitride deposition according to one embodiment of the present invention;

FIG. 5 shows the magnetoresistive sensor following a nitride etch according to one embodiment of the present invention;

DETAILED DESCRIPTION

Figure 1:
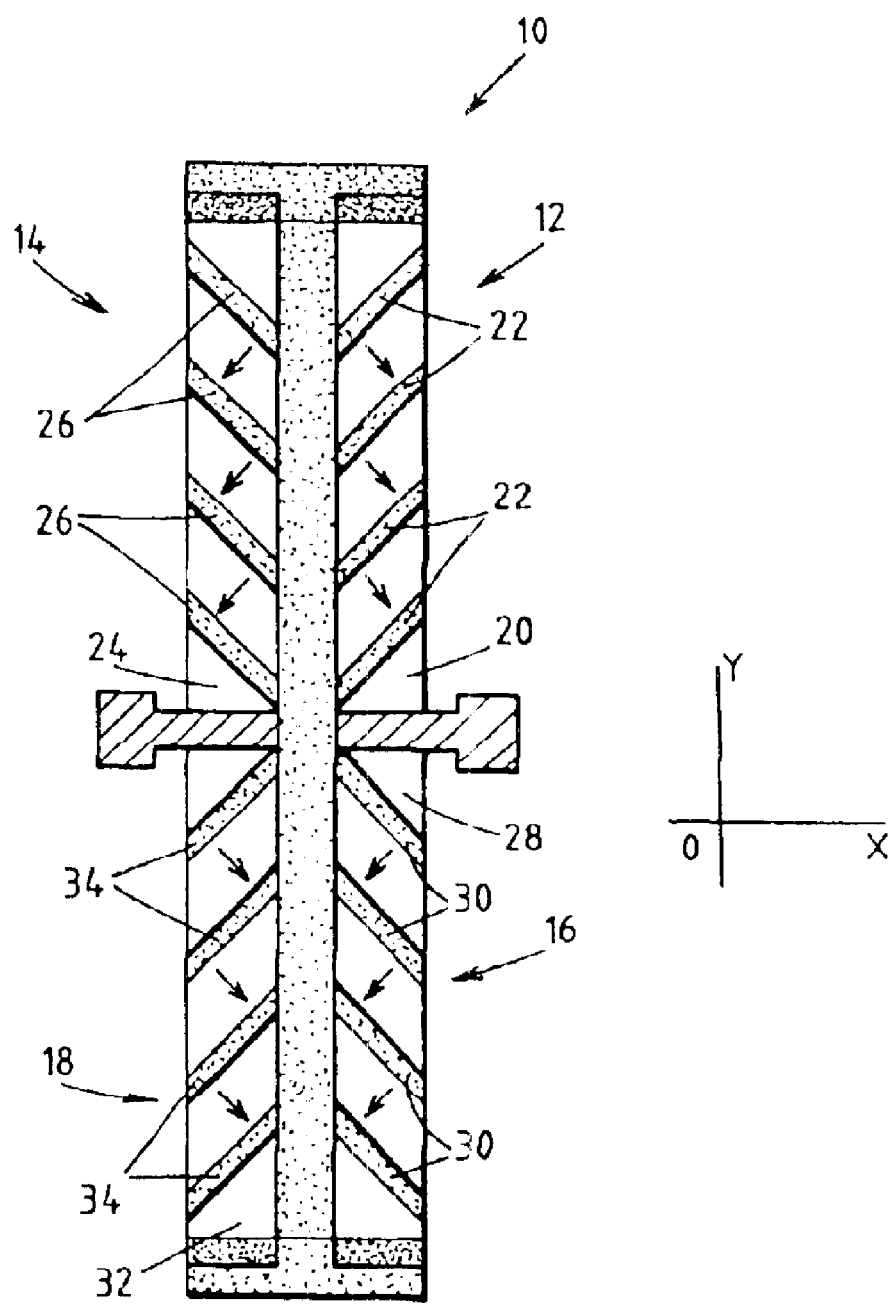
FIG. 1 shows a known Wheatstone bridge having magnetoresistive sensors formed of Permalloy (NiFe) films and barber poles.
Figure 2:
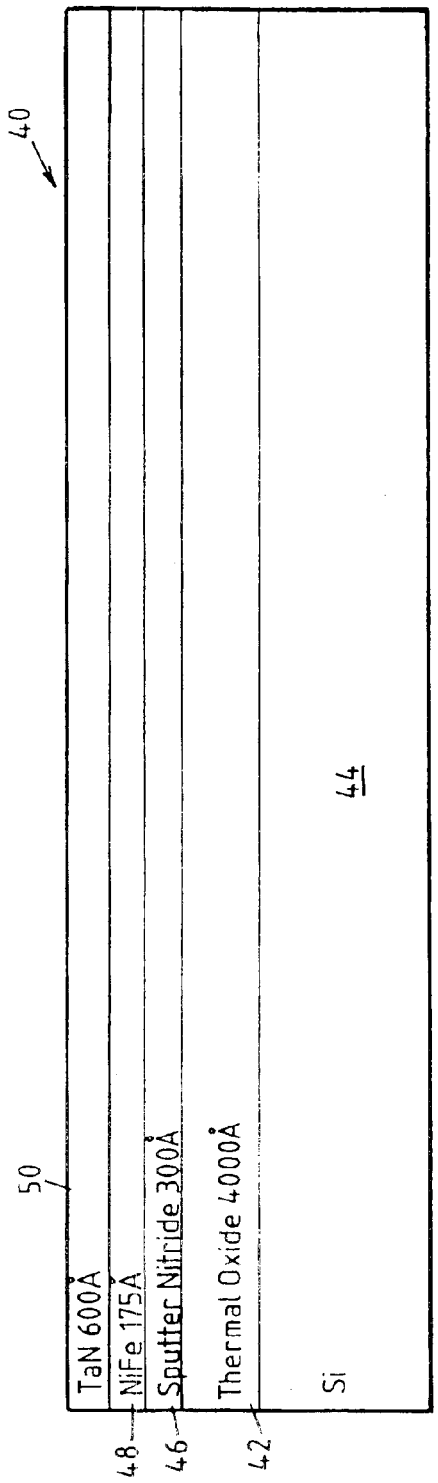
FIG. 2 shows a Permalloy layer and a Tantalum nitride (TaN) layer resulting from preliminary steps in the formation of a magnetoresistive sensor according to one embodiment of the present invention.

A magnetoresistive sensor 40 as illustrated in FIG. 2 is produced by depositing a thermal oxide layer 42 over a silicon substrate 44. (The view in FIG. 2 is a side view of one magnetoresistive sensor.) The thermal oxide layer 42 is a dielectric layer used to electrically isolate the silicon substrate 44 from the rest of the magnetoresistive sensor 40 and may have a thickness of, for example, 4000 Å. A nitride layer 46 is sputtered over the thermal oxide layer 42. The nitride layer 46 may have a thickness of, for example, 300 Å. Over the nitride layer 46 is deposited a Permalloy layer 48 to a thickness, for example, of 175 Å, and a tantalum nitride layer 50 is deposited over the Permalloy layer 48 to a thickness, for example, of 600 Å.

The nitride layer 46 provides an atomically smooth surface for the Permalloy layer 48, and creates a barrier between the thermal oxide layer 42 and the Permalloy layer 48. The tantalum nitride layer 50 provides a good hard etch mask and a good barrier that allows only a small amount of current to flow through it with most of the current flowing through the upper conductive layers of the magnetoresistive sensor 40.

Figure 3:
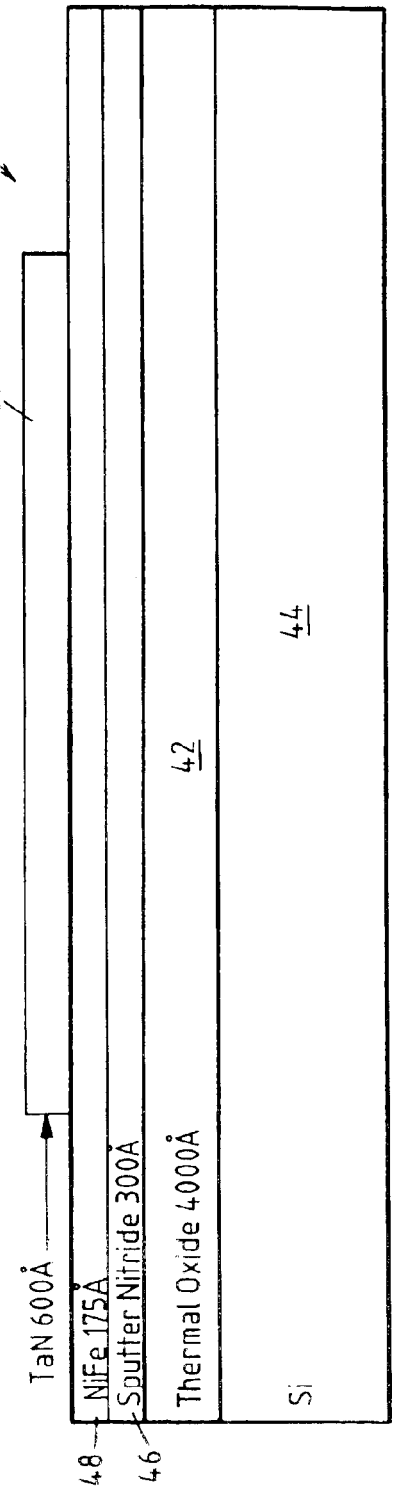
FIG. 3 shows the magnetoresistive sensor following a Tantalum nitride etch according to one embodiment of the present invention.

As illustrated in FIG. 3, the tantalum nitride layer 50 is selectively etched so that the portions of tantalum nitride layer 50 over the ends of the Permalloy layer 48 are removed. As illustrated in FIG. 4, the exposed portions of the Permalloy layer 48 are etched away so that the Permalloy layer 48 is substantially commensurate with the Tantalum nitride layer 50 and so that the exposed portions of the nitride layer 46 are partially etched. Then a dielectric layer 52, such as silicon dioxide or silicon nitride, is sputtered over the tantalum nitride layer 50 and the exposed and partially etched portions of the nitride layer 46. The dielectric layer 52 may have a thickness, for example, of 800 Å.

Figure 6:
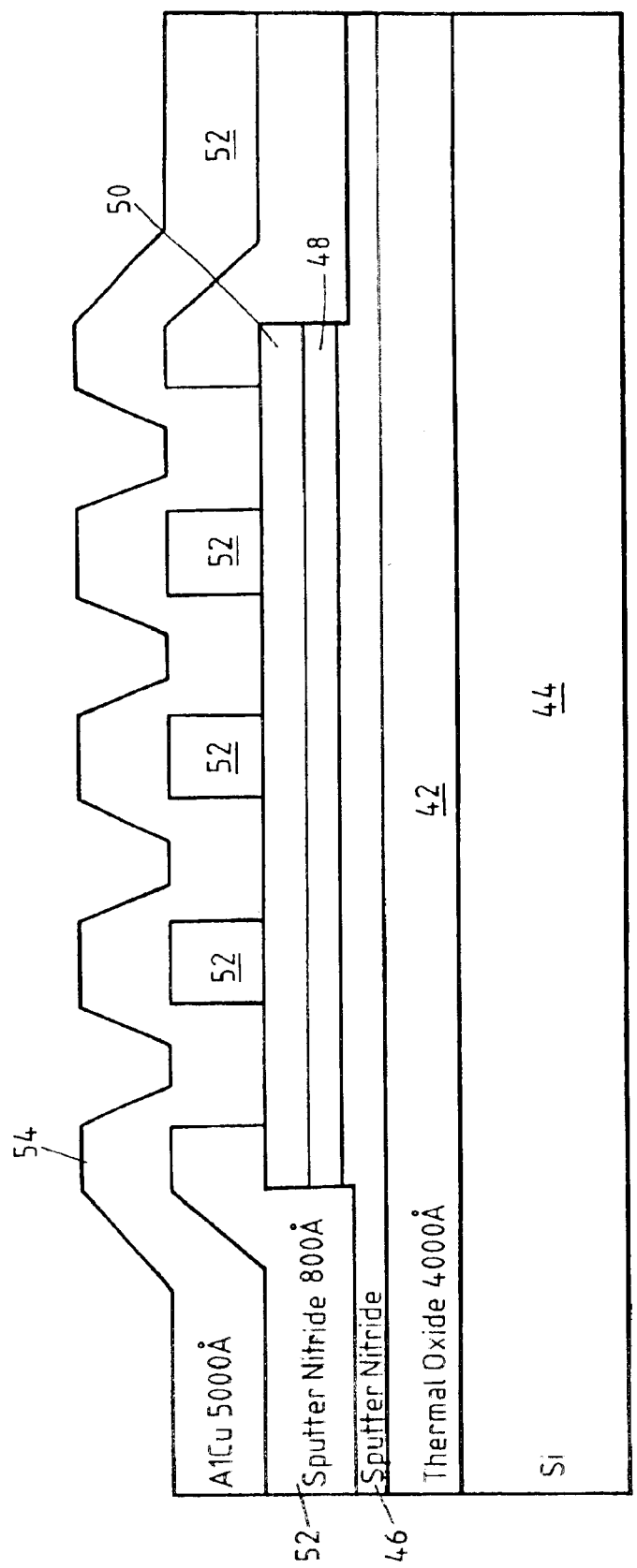
FIG. 6 shows the magnetoresistive sensor following deposition of a conductive layer according to one embodiment of the present invention.

As shown in FIG. 5, the dielectric layer 52 is selectively etched to form windows 53 down to the tantalum nitride layer 50. The pattern of the windows 53, which are formed by the remaining dielectric layer 52, defines the barber poles that are formed by subsequent processing. As shown in FIG. 6, this subsequent processing includes the deposition of a conducting layer 54, such as aluminum copper (AlCu), over the dielectric layer 52 and through the windows 53 in the dielectric layer 52 down to the tantalum nitride layer 50. The conducting layer 54 may have a thickness, for example, of 5000 Å.

Figure 7:
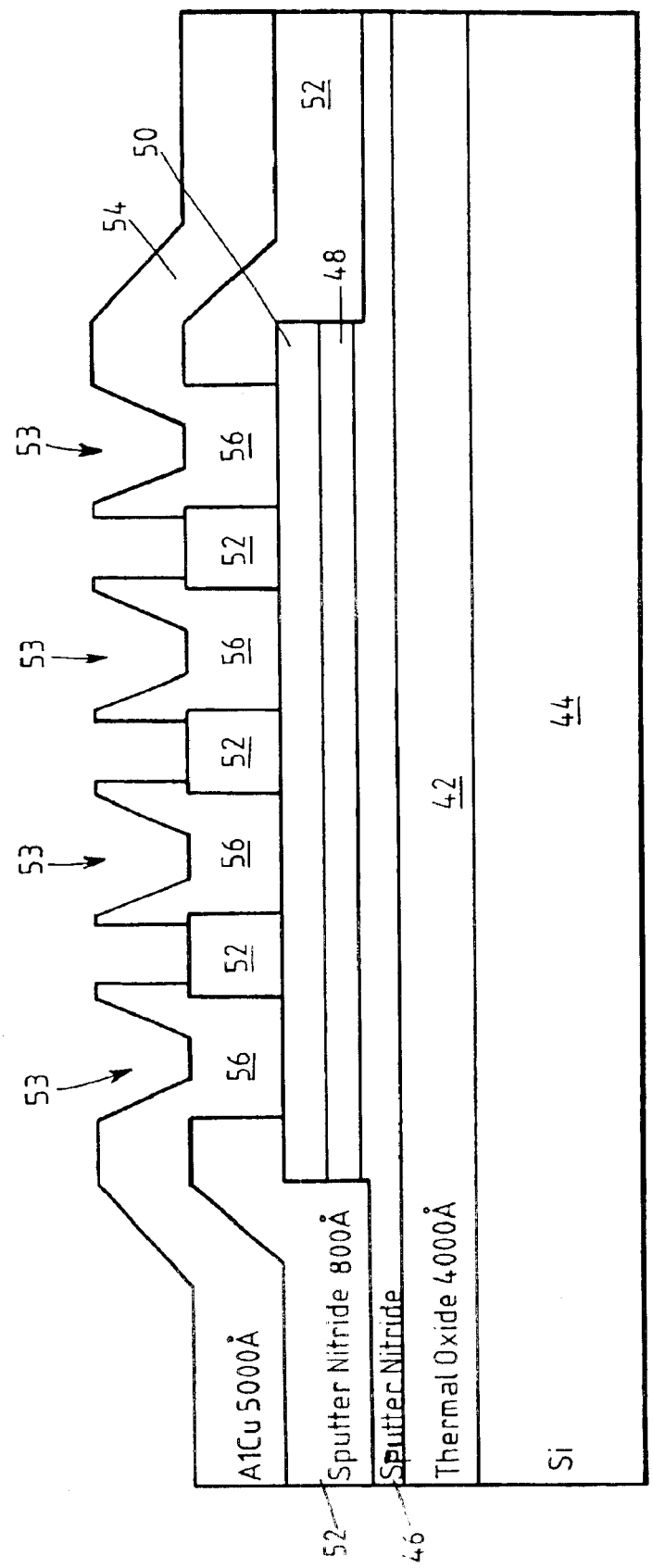
FIG. 7 shows the barber poles of the magnetoresistive sensor following selective etching of the conductive layer according to one embodiment of the present invention; and, FIG. 8 shows the barber poles of a magnetoresistive sensor resulting from conventional processing.

Finally, as shown in FIG. 7, the conducting layer 54 between the windows is selectively etched to form barber poles 56. Each of the barber poles 56 is insulated from an adjacent barber pole by corresponding portions of the dielectric layer 52. The barber poles 56 may be compared to known barber poles 58 which are shown in FIG. 8.

Figure 8:
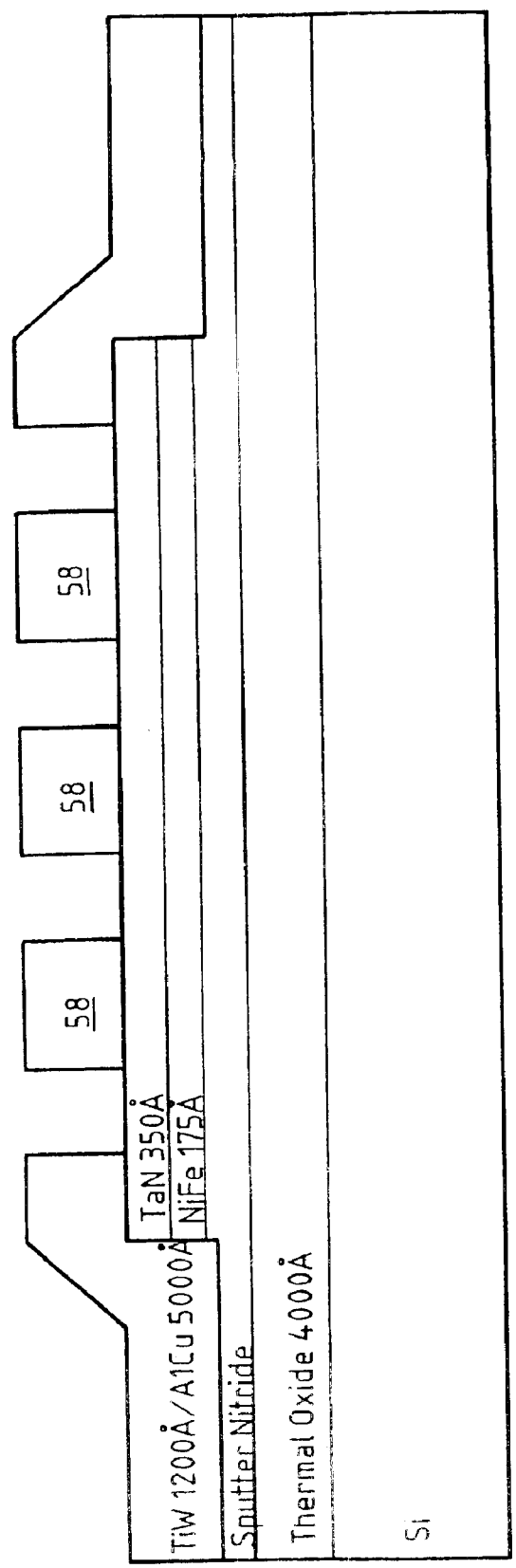

The process of defining the barber poles 56 by use of the windows 53 formed in the dielectric layer 52 allows the shape and size of the barber poles 56 to be controlled better than where the size and shape of the barber poles are controlled by the etching of the barber pole metal itself, as is the case with the magnetoresistive sensor shown in FIG. 8. Accordingly, the present invention leads to tighter control of bridge offset and less reliance on laser trimming. Moreover, the present invention results in better sensor bridge resistance control because the dielectric layer 52 permits better definition of the contact area between the barber pole metal and the Permalloy layer and because the dielectric layer 52 permits smoother barber pole edges.

Certain modifications of the present invention will occur to those practicing in the art of the present invention. For example, the magnetoresistive sensor 40 is shown with each of the layers 42, 44, 46, 48, 50, 52, and 54. However, one or more of these layers may be omitted or may be replaced by other layers, and/or additional layers may be provided.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A method of making a magnetoresistive sensor comprising:

forming a diffusion barrier over a magnetoresistive material;

forming a dielectric over the diffusion barrier;

forming barber pole windows through the dielectric; and, forming barber poles through the barber pole windows.

2. The method of claim 1 wherein the magnetoresistive material comprises Permalloy.

3. The method of claim 1 wherein the formation of the dielectric comprises depositing the dielectric over the diffusion barrier.

4. The method of claim 3 wherein the formation of the barber pole windows through the dielectric comprises selectively etching the dielectric to form the barber pole windows.

5. The method of claim 4 wherein the formation of the barber poles comprises depositing conductors through the barber pole windows.

6. The method of claim 5 wherein the deposition of the conductors through the barber pole windows comprises depositing a conductive material over the dielectric and the barber pole windows and etching the conductive material to separate the barber poles.

7. The method of claim 1 wherein the formation of the barber pole windows through the dielectric comprises selectively etching the dielectric to form the barber pole windows.

8. The method of claim 7 wherein the formation of the barber poles comprises depositing conductors through the barber pole windows.

9. The method of claim 8 wherein the deposition of the conductors through the barber pole windows comprises depositing a conductive material over the dielectric and into the barber pole windows and etching the conductive material to separate the barber poles.

10. The method of claim 1 wherein the formation of the barber poles comprises depositing conductors through the barber pole windows.

11. The method of claim 10 wherein the deposition of the conductors through the barber pole windows comprises depositing a conductive material over the dielectric and into the barber pole windows and etching the conductive material to separate the barber poles.

12. The method of claim 1 wherein the formation of the barber poles comprises depositing a conductive material over the dielectric and into the barber pole windows and etching the conductive material to separate the barber poles.

13. The method of claim 1 wherein the diffusion barrier comprises a diffusion barrier having high resistivity.

14. The method of claim 13 wherein the diffusion barrier comprises tantalum nitride.

15. The method of claim 1 further comprising removing a portion of the diffusion barrier prior to forming the dielectric over the diffusion barrier.

16. A method of making a magnetoresistive sensor comprising:
   forming a magnetoresistive strip over a substrate;
   forming a high resistance material over the magnetoresistive strip;
   forming an insulating layer over the high resistance material;
   forming barber pole windows through the insulating layer;
   forming a conductive material over the insulating layer and into the barber windows; and,
   removing the conductive material between the barber pole windows so as to form barber poles.

17. The method of claim 16 wherein the high resistance material comprises a tantalum nitride strip, and wherein the forming of the insulating layer comprises forming the insulating layer over the tantalum nitride strip.

18. The method of claim 17 wherein the magnetoresistive strip has ends, wherein the tantalum nitride strip has ends, wherein the method further comprises removing the ends of the tantalum nitride strip and the magnetoresistive strip, and wherein the forming of the insulating layer comprises forming the insulating layer over the tantalum nitride strip and into areas left by the removing of the ends of the tantalum nitride strip.

19. The method of claim 18 further comprising forming a thermal oxide layer over the silicon substrate, wherein the forming of the magnetoresistive strip comprises forming the magnetoresistive strip over the thermal oxide layer.

20. The method of claim 18 further comprising forming a nitride layer over the silicon substrate, wherein the forming of the magnetoresistive strip comprises forming the magnetoresistive strip over the nitride layer.

21. The method of claim 18 further comprising forming a thermal oxide layer over the silicon substrate and forming a nitride layer over the thermal oxide layer, wherein the forming of the magnetoresistive strip comprises forming the magnetoresistive strip over the nitride layer.

22. The method of claim 16 wherein the magnetoresistive strip has ends, wherein the method further comprises removing the ends of the magnetoresistive strip, and wherein the forming of the insulating layer comprises forming the insulating layer over the magnetoresistive strip and into areas left by the removing of the ends of the magnetoresistive strip.

23. The method of claim 22 further comprising forming a thermal oxide layer over the silicon substrate, wherein the forming of the magnetoresistive strip comprises forming the magnetoresistive strip over the thermal oxide layer.

24. The method of claim 22 further comprising forming a nitride layer over the silicon substrate, wherein the forming of the magnetoresistive strip comprises forming the magnetoresistive strip over the nitride layer.

25. The method of claim 22 further comprising forming a thermal oxide layer over the silicon substrate and forming a nitride layer over the thermal oxide layer, wherein the forming of the magnetoresistive strip comprises forming the magnetoresistive strip over the nitride layer.

26. The method of claim 16 further comprising forming a thermal oxide layer over the silicon substrate, wherein the forming of the magnetoresistive strip comprises forming the magnetoresistive strip over the thermal oxide layer.

27. The method of claim 16 further comprising forming a nitride layer over the silicon substrate, wherein the forming of the magnetoresistive strip comprises forming the magnetoresistive strip over the nitride layer.

28. The method of claim 16 further comprising forming a thermal oxide layer over the silicon substrate and forming a nitride layer over the thermal oxide layer, wherein the forming of the magnetoresistive strip comprises forming the magnetoresistive strip over the nitride layer.

29. The method of claim 16 further comprising removing a portion of the high resistance material prior to forming the insulating layer over the high resistance material.

30. A magnetoresistive sensor comprising:
   a substrate;
   a magnetoresistive strip over the substrate;
   barber poles of conductive material over the magnetoresistive strip;
   a high resistance material between the barber poles and the magnetoresistive strip; and,
   a dielectric between adjacent ones of the barber poles.

31. The magnetoresistive sensor of claim 30 wherein the high resistance material comprises tantalum nitride.

32. The magnetoresistive sensor of claim 31 wherein the dielectric layer is also over sides of the tantalum nitride and the magnetoresistive strip.

33. The magnetoresistive sensor of claim 32 further comprising a thermal oxide layer between the silicon substrate and the magnetoresistive strip.

34. The magnetoresistive sensor of claim 32 further comprising a nitride layer between the silicon substrate and the magnetoresistive strip.

35. The magnetoresistive sensor of claim 32 further comprising a thermal oxide layer over the silicon substrate and a nitride layer between the thermal oxide layer and the magnetoresistive strip.

36. The magnetoresistive sensor of claim 30 wherein the dielectric layer is also over sides of the magnetoresistive strip.

37. The magnetoresistive sensor of claim 36 further comprising a thermal oxide layer between the silicon substrate and the magnetoresistive strip.

38. The magnetoresistive sensor of claim 36 further comprising a nitride layer between the silicon substrate and the magnetoresistive strip.

39. The magnetoresistive sensor of claim 36 further comprising a thermal oxide layer over the silicon substrate and a nitride layer between the thermal oxide layer and the magnetoresistive strip.

40. The magnetoresistive sensor of claim 30 further comprising a thermal oxide layer between the silicon substrate and the magnetoresistive strip.

41. The magnetoresistive sensor of claim 30 further comprising a nitride layer between the silicon substrate and the magnetoresistive strip.

42. The magnetoresistive sensor of claim 30 further comprising a thermal oxide layer over the silicon substrate and a nitride layer between the thermal oxide layer and the magnetoresistive strip.

43. The magnetoresistive sensor of claim 30 wherein the dielectric covers a top and at least one side of the high resistance material.

* * * * *

UNITED STATES PATENT AND TRADEMARK OFFICE
CERTIFICATE OF CORRECTION

PATENT NO. : 6,850,057 B2
DATED : February 1, 2005
INVENTOR(S) : William F. Witcraft et al.

It is certified that error appears in the above-identified patent and that said Letters Patent is hereby corrected as shown below:

<u>Title page,</u>
Item [57], ABSTRACT,
Lines 1, 2 and 3, change "magnetorestrictive" to -- magnetoresistive --.

Signed and Sealed this

Twenty-seventh Day of September, 2005

JON W. DUDAS
*Director of the United States Patent and Trademark Office*